US011653456B2

(12) United States Patent
Seo et al.

(10) Patent No.: US 11,653,456 B2
(45) Date of Patent: May 16, 2023

(54) DISPLAY DEVICE

(71) Applicant: LG ELECTRONICS INC., Seoul (KR)

(72) Inventors: Daeseong Seo, Seoul (KR); Namhun Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 116 days.

(21) Appl. No.: 17/042,869

(22) PCT Filed: Dec. 7, 2018

(86) PCT No.: PCT/KR2018/015525
§ 371 (c)(1),
(2) Date: Sep. 28, 2020

(87) PCT Pub. No.: WO2020/013401
PCT Pub. Date: Jan. 16, 2020

(65) Prior Publication Data
US 2021/0059060 A1 Feb. 25, 2021

(30) Foreign Application Priority Data

Jul. 12, 2018 (KR) .................. 10-2018-0080969

(51) Int. Cl.
*H05K 5/02* (2006.01)
*H05K 5/00* (2006.01)

(52) U.S. Cl.
CPC ......... *H05K 5/0017* (2013.01); *H05K 5/0247* (2013.01)

(58) Field of Classification Search
CPC .............. G02F 1/13452; H05K 5/0017; H05K 5/0247; H05K 3/361; H05K 1/148;
(Continued)

(56) References Cited

U.S. PATENT DOCUMENTS 7,334,765 B2* 2/2008 Hwang .............. F16M 11/2092
248/923
8,363,198 B2* 1/2013 Lee .................... G02F 1/13452
349/150
(Continued)

FOREIGN PATENT DOCUMENTS

EP 3333623 6/2018
JP 2004271611 9/2004
(Continued)

OTHER PUBLICATIONS

European Patent Office Application Serial No. 18925816.3, Search Report dated Dec. 1, 2021, 8 pages.
(Continued)

*Primary Examiner* — Hung S. Bui
*Assistant Examiner* — Sagar Shrestha
(74) *Attorney, Agent, or Firm* — Lee, Hong, Degerman, Kang & Waimey PC

(57) ABSTRACT

The present application provides a display device which is adapted to changes in the installation environment. The present application provides a display device comprising a display panel, a main board spaced apart from the display panel and configured to control a driving signal, an auxiliary board disposed adjacent to the display panel and configured to receive a driving signal from the main board and provide the display panel with the driving signal in an appropriate form for image reproduction, and a bridge board interposed between the main board and the auxiliary board so as to connect the main board to the auxiliary board.

15 Claims, 16 Drawing Sheets

(58) Field of Classification Search
CPC .......... H05K 2201/10128; H05K 2201/10356; H05K 1/0283; G09F 15/0006; H01L 51/52; H01L 27/3244; H01L 2251/5338; H01R 12/526

See application file for complete search history.

(56) References Cited

U.S. PATENT DOCUMENTS

| | | | |
|---|---|---|---|
| 10,595,426 B2* | 3/2020 | Ryu | H04N 5/64 |
| 10,915,074 B2* | 2/2021 | Chun | H01B 9/006 |
| 10,931,047 B2* | 2/2021 | Lee | H01R 12/78 |
| 2004/0085371 A1* | 5/2004 | Lee | G09G 3/3655 346/45 |
| 2004/0232298 A1* | 11/2004 | Bremmon | G09F 7/18 248/397 |
| 2006/0118694 A1* | 6/2006 | Lee | F16M 11/2064 40/711 |
| 2008/0074334 A1* | 3/2008 | Kang | H01Q 1/243 343/702 |
| 2010/0302494 A1* | 12/2010 | Lee | G02F 1/13452 349/150 |
| 2013/0088816 A1* | 4/2013 | Koizumi | G02F 1/133308 361/679.01 |
| 2014/0071081 A1* | 3/2014 | Shedletsky | G06F 1/18 361/767 |
| 2014/0211100 A1* | 7/2014 | Massey | F16M 11/2014 348/836 |
| 2014/0265765 A1* | 9/2014 | Khodapanah | F16M 11/10 248/224.8 |
| 2015/0109170 A1* | 4/2015 | Kang | H04B 1/3833 343/702 |
| 2015/0222032 A1* | 8/2015 | Goo | G02F 1/13452 361/748 |
| 2016/0322724 A1* | 11/2016 | Lee | H01R 12/771 |
| 2017/0181295 A1* | 6/2017 | Gu | G02F 1/13452 |
| 2018/0168060 A1* | 6/2018 | Ryu | H05K 5/0017 |
| 2018/0270443 A1* | 9/2018 | Kang | F16M 11/2021 |
| 2018/0270972 A1* | 9/2018 | Kang | H05K 5/0217 |
| 2018/0336818 A1* | 11/2018 | Zheng | G09G 3/3225 |
| 2019/0067844 A1* | 2/2019 | Go | H01R 12/52 |
| 2019/0072804 A1* | 3/2019 | Sugiyama | G09F 9/00 |
| 2019/0191577 A1* | 6/2019 | Declerck | F16B 5/0621 |
| 2019/0335135 A1* | 10/2019 | Massey | F16M 13/02 |
| 2020/0045820 A1* | 2/2020 | Jin | H05K 1/147 |
| 2020/0214127 A1* | 7/2020 | Choi | H05K 3/361 |
| 2020/0286922 A1* | 9/2020 | Huang | H05K 1/189 |
| 2021/0074733 A1* | 3/2021 | Huang | H01L 23/49838 |

FOREIGN PATENT DOCUMENTS

| | | |
|---|---|---|
| KR | 1020100128824 | 12/2010 |
| KR | 1020170086181 | 7/2017 |
| KR | 1020170096534 | 8/2017 |
| KR | 1020170140520 | 12/2017 |
| KR | 1020180067143 | 6/2018 |

OTHER PUBLICATIONS

PCT International Application No. PCT/KR2018/015525, Notification of Transmittal of The International Search Report and the Written Opinion of the International Searching Authority, or Declaration dated Apr. 5, 2019, 11 pages.

* cited by examiner (a)

(b)

DISPLAY DEVICE

CROSS-REFERENCE TO RELATED APPLICATIONS

This application is the National Stage filing under 35 U.S.C. 371 of International Application No. PCT/KR2018/015525, filed on Dec. 7, 2018, which claims the benefit of earlier filing date and right of priority to Korean Application No. 10-2018-0080969, filed on Jul. 12, 2018, the contents of which are all hereby incorporated by reference herein in their entirety.

TECHNICAL FIELD

The present invention relates to a display device, and more particularly, to a configuration for arrangement of a display device.

BACKGROUND ART

A display device is a device having a function of receiving, processing and displaying an image that may be watched by a user. The display device, for example, receives broadcasting selected by a user, among broadcast signals transmitted from a broadcast station, splits a video signal from the received signals, and displays the split video signal.

The display device has been continuously developed to have a compact external appearance and improved performance. Therefore, the display device is applied to more various fields, whereby its arrangement environments or its arrangement conditions are diversified. For example, it is general that the display device is arranged on a flat floor or fixed to a flat wall. However, the display device is recently required to be arranged on walls of various shapes. Therefore, the display device needs to be improved to be adapted to this changed arrangement environment or condition.

DISCLOSURE

Technical Problem

An object of the present application is to provide a display device configured to be adapted to various arrangement conditions.

Technical Solution

To achieve the aforementioned object, the present application may provide a display device comprising a display panel, a main board spaced apart from the display panel and configured to control a driving signal, an auxiliary board disposed to be adjacent to the display panel and configured to provide the display panel with the driving signal received from the main board, in an appropriate form for image reproduction, and a bridge board interposed between the main board and the auxiliary board to connect the main board with the auxiliary board.

The bridge board may be configured to connect the main board with the auxiliary board by using at least two different cables, and the cable connecting the bridge board with the auxiliary board may be configured to be different from a cable connecting the bridge board with the main board.

In more detail, the bridge board may include a first bridge board connected with the auxiliary board through a first cable and connected with the main board through a second cable. Also, the bridge board may further include a second bridge board connected with the first bridge board through the second cable and connected with the main board through a third cable.

The first bridge board may include a first terminal connected with the first cable and a second terminal connected with the second cable, and the second bridge board may include a third terminal connected with the third cable and a fourth terminal connected with the second cable.

The first and third cables may be made of flexible flat cables, and the second cable may be made of a coaxial cable.

The auxiliary board may directly be connected with the display panel. Also, the display panel may be configured to have a predetermined curvature. In this case, the auxiliary board may be divided into a plurality of board modules arranged along a curvature forming direction of the display panel. Moreover, the board modules may be connected with each other by an auxiliary connector.

Meanwhile, the display device of the present disclosure may further comprise a bracket provided on a rear surface of the display panel and configured to attach the panel on a predetermined wall, wherein the bracket may include fixing portions provided on a surface facing the wall, fixed to the wall and configured to mutually maintain a certain interval. The fixing portions may movably be configured toward another fixing portions adjacent thereto. Also, the bracket may further include spacers provided between the fixing portions, maintaining a certain distance between the fixing portions.

Advantageous Effects

According to various embodiments of the present application, the display device is configured to be adapted to an arrangement environment, more specifically, a shape change of an arrangement position.

For example, a display panel is modified to have a curvature adapted to a wall which is a curved surface. In accordance with the curvature, an auxiliary board is divided into a plurality of module boards. Also, a main board difficult to be modified is arranged to be spaced apart from the display panel, and an improved connection method such as application of a bridge board is used to avoid a defect caused by the above spaced arrangement, whereby the main board is connected with the auxiliary board by the improved connection method. That is, in accordance with a change of an arrangement environment according to the embodiments of the present application, shapes of corresponding parts are changed in the display device, and distribution and re-arrangement of related parts are performed.

For this reason, even though the arrangement environment is changed by the present application, the display device may stably be arranged while achieving a desired function.

BEST MODE FOR CARRYING OUT THE INVENTION

Figure 1:
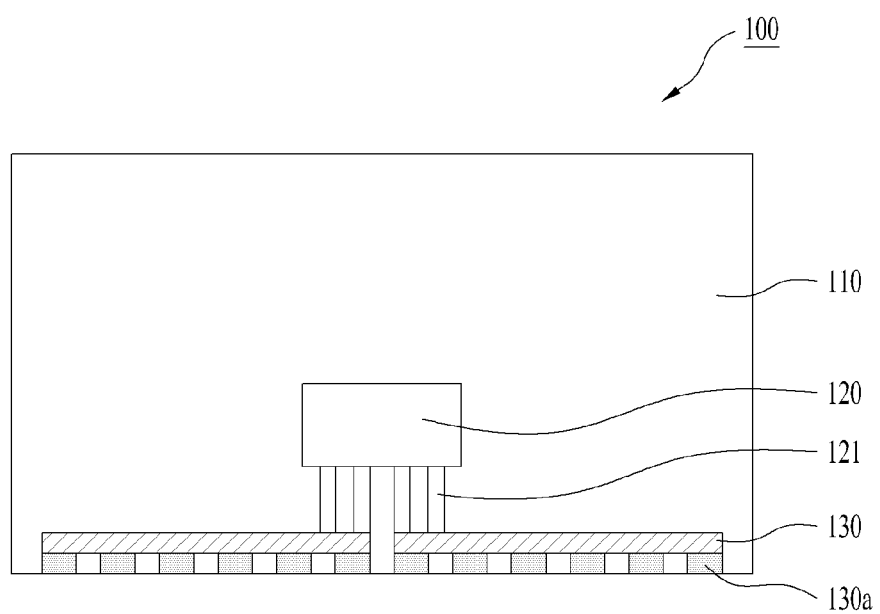
FIG. 1 is a plane view illustrating a rear surface of a display device having a flat display panel.

Reference will now be made in detail to the preferred embodiments of the present specification, examples of which are illustrated in the accompanying drawings.

Wherever possible, the same reference numbers will be used throughout the drawings to refer to the same or like parts. The suffixes "module" and "unit" for the elements used in the following description are given or used in common by considering facilitation in writing this disclosure only but fail to have meanings or roles discriminated from each other. Also, in description of the embodiments disclosed in this specification, if detailed description of the disclosure known in respect of the present disclosure is determined to make the subject matter of the embodiments disclosed in this specification obscure, the detailed description will be omitted. Also, the accompanying drawings are only intended to facilitate understanding of the embodiments disclosed in this specification, and it is to be understood that technical spirits disclosed in this specification are not limited by the accompanying drawings and the accompanying drawings include all modifications, equivalents or replacements included in technical spirits and technical scope of the present disclosure.

Although the terms such as "first" and/or "second" in this specification may be used to describe various elements, it is to be understood that the elements are not limited by such terms. The terms may be used to identify one element from another element.

The expression that an element is "connected" or "coupled" to another element should be understood that the element may directly be connected or coupled to another element, a third element may be interposed between the corresponding elements, or the corresponding elements may be connected or coupled to each other through a third element. On the other hand, the expression that an element is "directly connected" or "directly coupled" to another element" means that no third element exists therebetween.

It is to be understood that the singular expression used in this specification includes the plural expression unless defined differently on the context.

In this application, it is to be understood that the terms such as "comprise", "include" and "has" are intended to designate that features, numbers, steps, operations, elements, parts, or their combination, which are disclosed in the specification, exist, and are intended so as not to previously exclude the presence or optional possibility of one or more other features, numbers, steps, operations, elements, parts, or their combinations. Also, for the same reason, it is to be understood that the present application includes a combination of features, numbers, steps, operations, elements and parts, which are partially omitted from the combination of features, numbers, steps, operations, elements and parts, which are described using the aforementioned terms, unless it departs from intended technical objects and effects.

The embodiments described in the present specification relate to a flat panel display device. However, it will be apparent to those skilled in the art that the principles and configuration of the described embodiments may substantially equally be applied to the other display devices.

Figure 2:
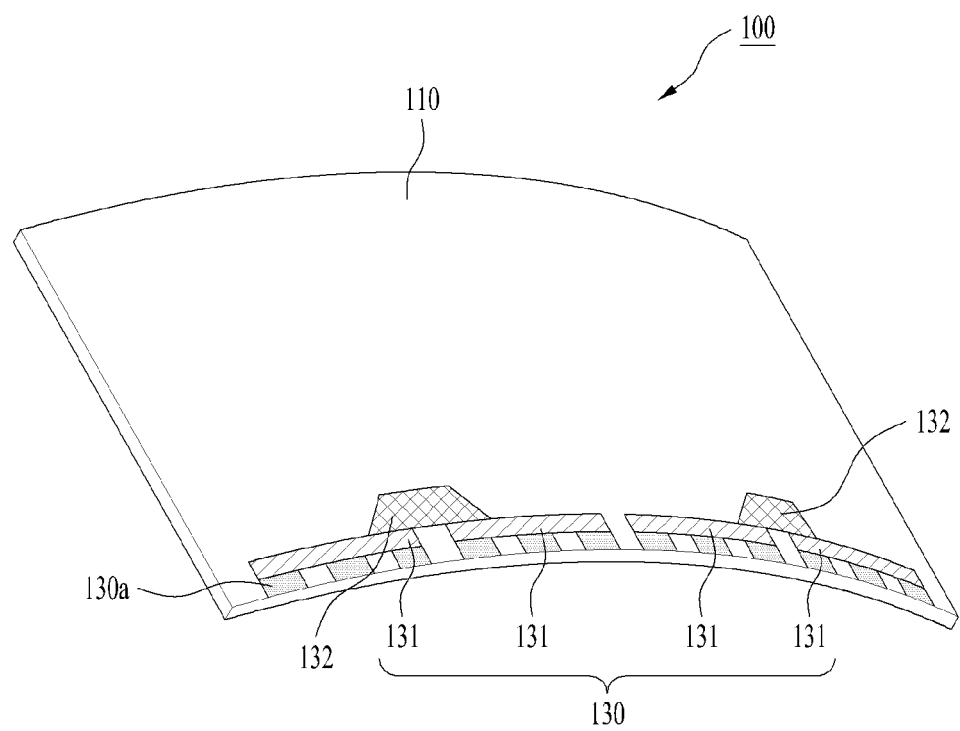
FIG. 2 is a perspective view illustrating a rear surface of a display device having a display panel modified to a predetermined curvature.
Figure 3:
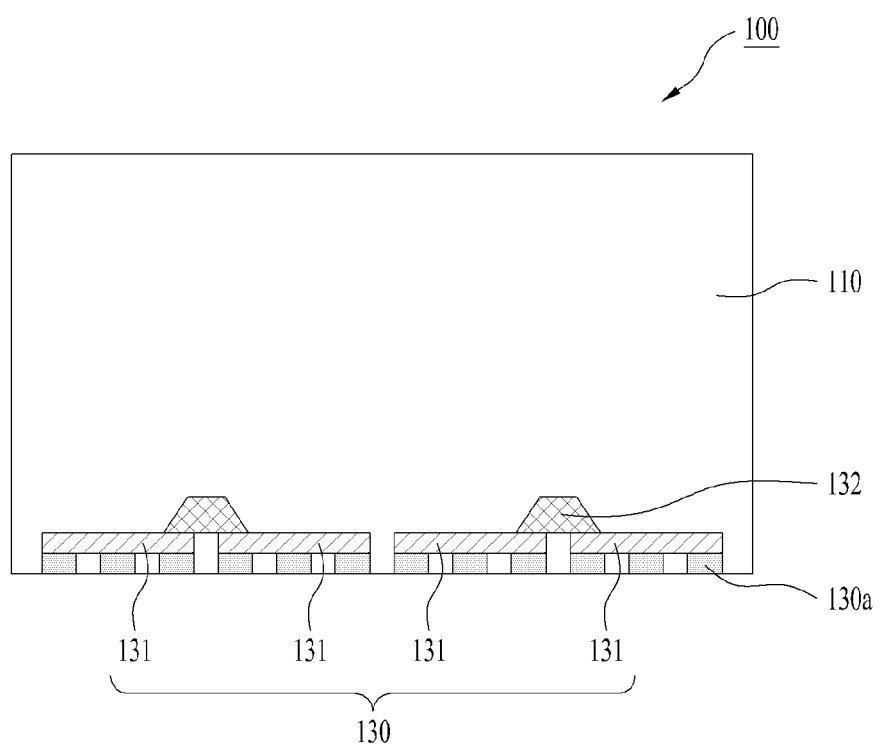
FIG. 3 is a plane view illustrating a rear surface of a display device having a display panel modified to a predetermined curvature.

FIG. 1 is a plane view illustrating a rear surface of a display device having a flat display panel. FIG. 2 is a perspective view illustrating a rear surface of a display device having a display panel modified to a predetermined curvature. FIG. 3 is a plane view illustrating a rear surface of a display device having a display panel modified to a predetermined curvature. In FIGS. 1 to 3, a rear portion of the display device is shown to well show an inner structure of the display device.

Referring to FIGS. 1 to 3, a display device 100 may include a display panel 110. The display panel 110 is a part for substantially embodying an image in the display device 100, and may have various configurations in accordance with the principle of embodying an image. Also, the display panel 110 may generally be comprised of a flat panel display having a thin plate shape in accordance with the development in the corresponding art. For example, the display panel 110 is recently comprised of a liquid crystal display (hereinafter, 'LCD') or an organic light emitting diode (hereinafter, 'OLED'). Among these panels, the OLED may have a thickness thinner than that of the same sized LCD and a weight smaller than that of the same sized LCD. Also, the OLED is characterized in that it may structurally easily be modified, whereas the LCD may have a difficulty to be modified due to application of a light guide plate and other structural reasons. For these reasons, in the display device 100 of the present disclosure, the display panel 110 may be comprised of an OLED. However, if the display panel has the aforementioned structural advantages, for example, easiness in modification, a light weight, a thin thickness, etc., another type panel may be applied to the display device. Even in case of no these advantages, another type panel including an LCD may be applied to the display device if necessary.

Also, the display device 100 may include a main board 120 configured to control a signal for driving the display panel 110, that is, a driving signal. In more detail, the main board 120 may control an externally received digital video signal, for example, a source signal and display the digital video signal to the display panel 110 to exactly embody an image on the display panel 110. The main board 120 may include a control circuit configured to control the video signal, and the control circuit may be comprised of a processor and related electric/electronic parts. The control circuit may be mounted on a printed circuit board (hereinafter, 'PCB') of a predetermined size as shown in FIG. 1. That is, the main board 120 may be comprised of a PCB of a predetermined size and a control circuit mounted on the PCB. Also, since the main board 120 performs control and supply of the video signal, many parts are not required, whereby the main board 120 may have a small size as shown. The main board 120 is generally referred to as a T-Con board in the corresponding art. In another aspect, the main board 120 may be referred to as a control board (or controller board) or a control PCB in view of function.

Moreover, the display device 100 may include an auxiliary board 130 configured to provide the driving signal provided from the main board 120 to the display panel 110 in the form suitable for image display. For this function, the auxiliary board 130 may basically be connected with the main board 120 by a cable 121 to receive the driving signal, that is, the video signal (source signal) from the main board 120. The auxiliary board 130 may convert the digital video signal distributed by and transmitted from the main board 120 to an analog video signal. The auxiliary board 130 may transmit the converted analog video signal to corresponding pixels of the display panel 110. For this transmission, the auxiliary board 130 may directly be connected with the display panel 110. In more detail, the auxiliary board 130 may be connected with each of the pixels of the display panel by a connector 130a. Since both the auxiliary board 130 and the panel 110 are not easily modified, the connector 130a is comprised of a flexible body to appropriately connect the auxiliary board 130 with the panel 110, and may be comprised of a plurality of circuits arranged in the body and connected with each of the pixels of the panel 100. The auxiliary board 130 may include a source driver circuit for control and conversion of the digital video signal, that is, the source signal, and the driver circuit may be comprised of a processor and related electric/electronic parts. In the same manner as the main board 120 described as above, the driver circuit may be mounted on the PCB of a predetermined size as shown in FIG. 1. That is, the auxiliary board 130 may be comprised of a PCB of a predetermined size and a source driver circuit mounted on the PCB. Also, the auxiliary board 130 may longitudinally be extended along any one direction of the display panel 110, for example, a length direction of the panel 110 as shown, to be connected with the pixels of the display panel 110, whereby the auxiliary board 130 may be formed to be relatively greater than the main board 120. The auxiliary board 130 may be referred to as a source board or source PCB in view of function.

Meanwhile, as discussed in the aforementioned background art, as the display device 100 is applied to various fields, an arrangement environment or arrangement condition of the device 100 may be diversified. In more detail, the device 100 is required to be arranged in various positions. Particularly, the display device 100 is required to be arranged on walls of various shapes not a general flat wall. For example, the display device 100 may be provided in an airplane for various purposes, and many parts inside the airplane include a surface of a shape different from a flat surface, that is, a curved surface, due to a structural characteristic of the airplane. Therefore, as shown in FIG. 2, the display panel 110 may basically be configured to have a predetermined curvature in accordance with a shape of a wall. As described above, the display panel 110 comprised of OLED may be modified to have various curvatures matched with a curved surface of a wall body to be provided. In FIG. 2, the display panel 110 may be configured to have a curvature along a length direction as an example but may be configured to have a curvature along a width direction.

As discussed above, the auxiliary board 130 is directly connected with the display panel 110 unlike the main board 120. Also, if the connector 130a becomes long, since noise may occur in the signal provided to the panel 110, as shown, the auxiliary board 130 may be arranged to be adjacent to the panel 110 if possible, to reduce the length of the connector 130a. That is, the auxiliary board 130 is substantially arranged on the display panel 110, exactly on a rear surface of the display panel 110, whereby the auxiliary board 130 may be arranged between the wall to be arranged and the display panel 110. Therefore, if the display panel 110 is arranged on a wall having a curvature, the auxiliary board 130 needs to be modified to have a predetermined curvature together with the display panel 110. However, the auxiliary board 130, particularly its PCB has high rigidity due to its material characteristic, and may not be modified within a great range. Also, if the auxiliary board 130 is modified with a great range, the circuit mounted thereon may be damaged or noise may occur.

For this reason, as shown in FIGS. 2 and 3, the auxiliary board 130 may be comprised of a plurality of board modules 131. The board module 131 may be formed by dividing the auxiliary board 130, whereby the board module 131 may have a size remarkably smaller than that of the auxiliary board 131. The board module 131 may have a shape and a curvature corresponding to a portion of the display panel 110 adjacent thereto, due to the small size even in case of small modification. In this way, the board modules 131 modified to the small size may be arranged along a curvature forming direction, that is, a modified direction of the display panel 110, whereby the auxiliary board 130 may have a curvature and a shape corresponding to the curvature of the display panel 110. Therefore, the auxiliary board 130 may be provided on a wall having a curvature easily and stably together with the display panel 110. Meanwhile, if the main board 120 is connected with each of the divided board modules 131, the structure of the display device 100 may be complicated and its manufacturing cost may be increased. For this reason, the board modules 131 mutually adjacent to one another may be connected with one another using an auxiliary connector 132. Therefore, a video signal received in any one board module 131 connected to the main board 120 may be transmitted to another module 131, which is adjacent thereto, through the auxiliary connector 132. The auxiliary connector 132 may have a configuration similar to that of the aforementioned connector 130a.

Unlike the auxiliary board 130, the main board 120 is configured to have a small size from the first time as discussed above, nonetheless, the main board 120 is comprised of a PCH having high rigidity in the same manner as the auxiliary board 130. Therefore, the main board 120 cannot be modified within a great range, whereby it may be difficult for the main board 120 to be modified in accordance with a curvature of a wall which is arranged. For this reason, in the present application, the main board 120 has a modified arrangement and connection structure such that the display device 100 is provided on a wall having a stable curvature while performing an intended function. The modified arrangement and connection structure of the display device 100 will be described with reference to the related drawings.

Figure 4:
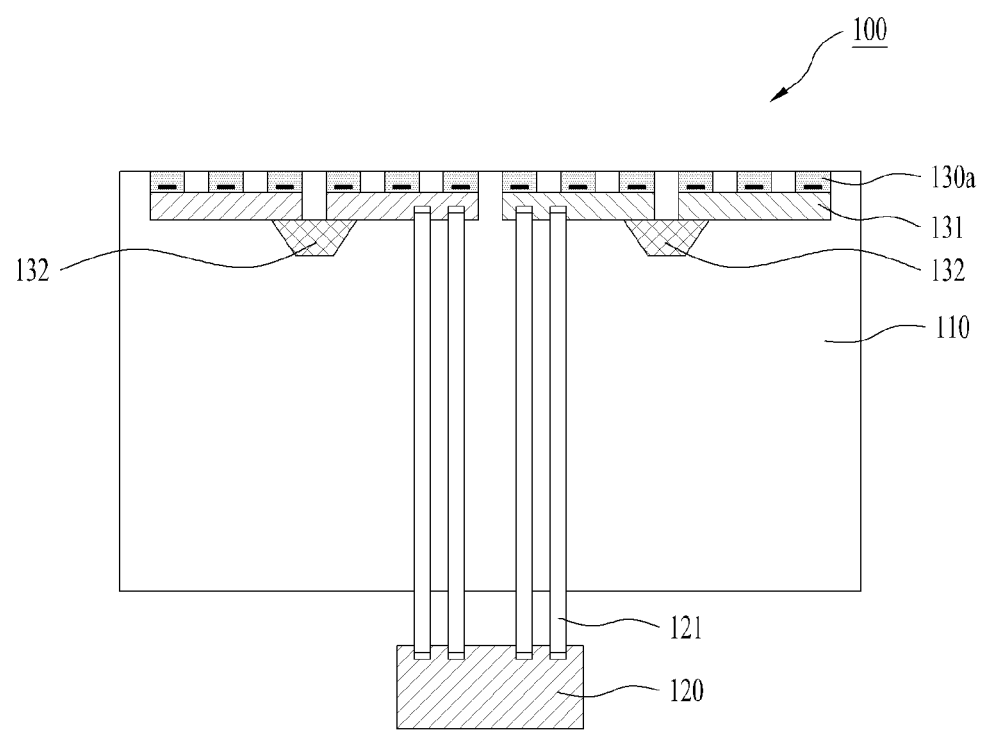
FIG. 4 is a detailed plane view illustrating one embodiment of a connection structure of a main board and an auxiliary board in a display device.
Figure 5:
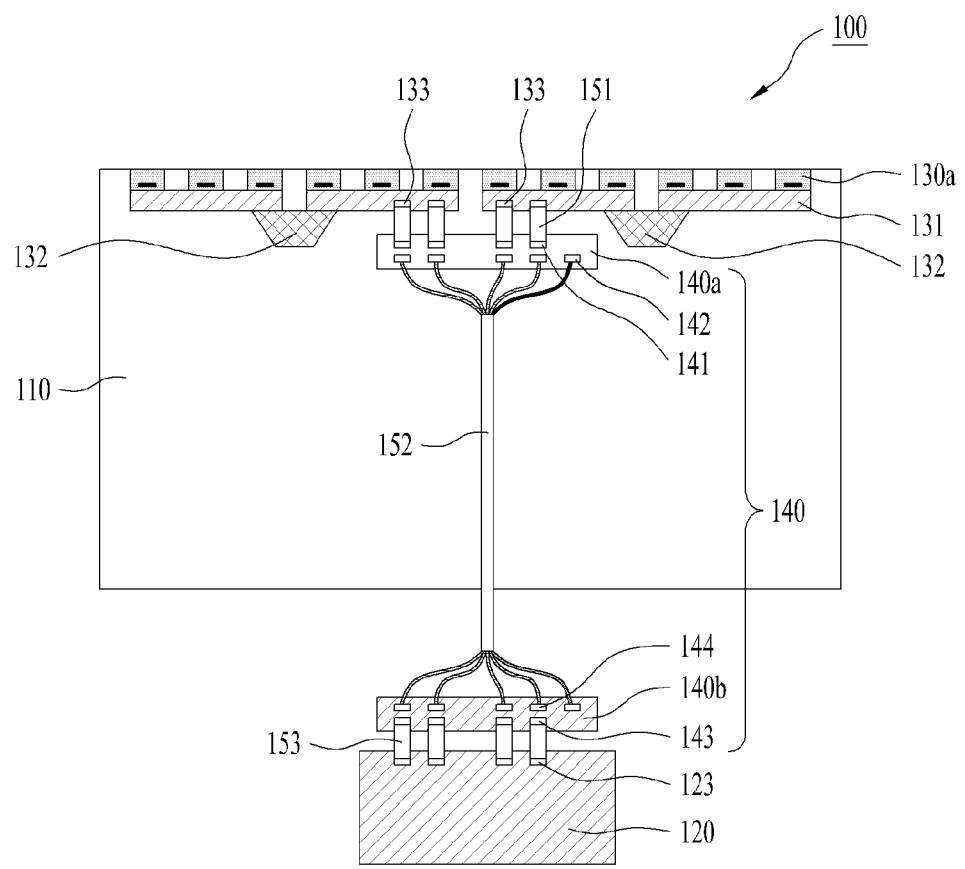
FIG. 5 is a detailed plane view illustrating another embodiment of a connection structure of a main board and an auxiliary board in a display device.
Figure 6:
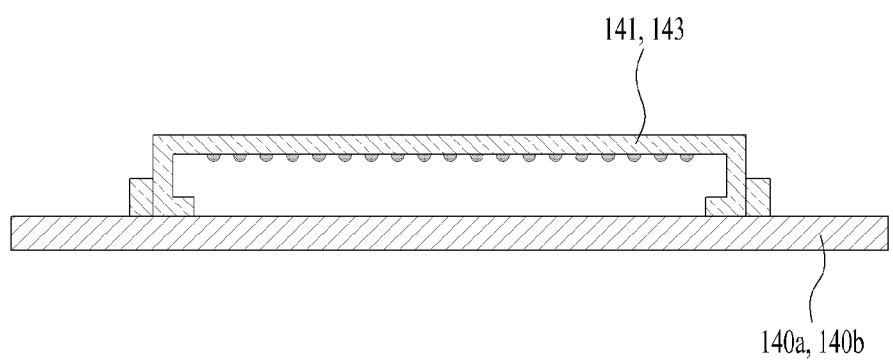
FIG. 6 is a detailed side view illustrating first and third terminals of a bridge board of FIG. 5.
Figure 7:
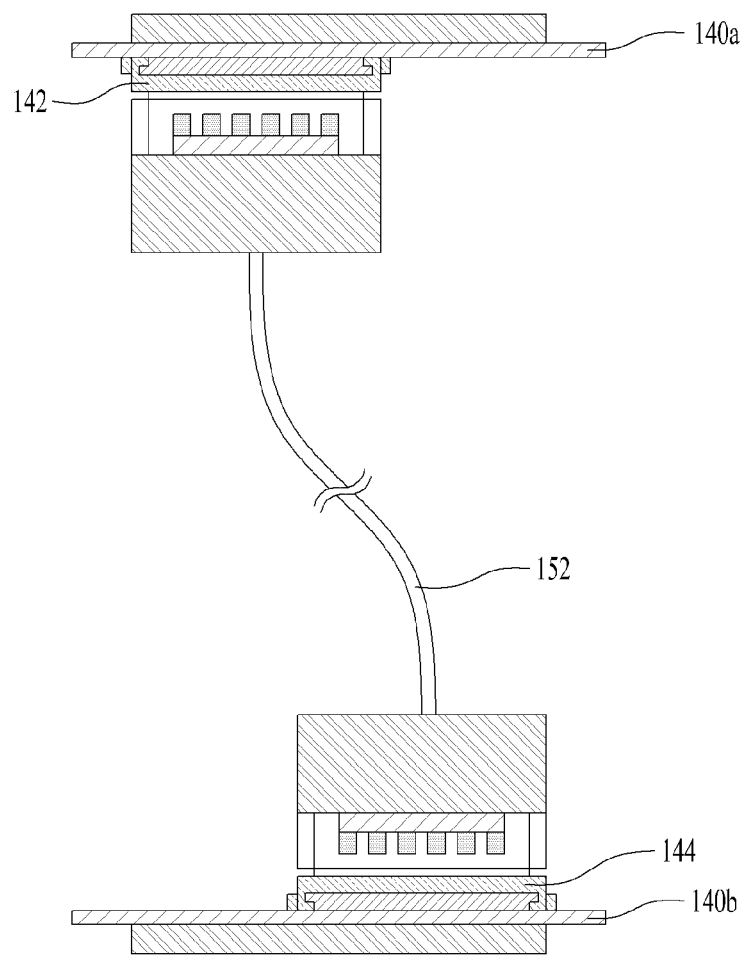
FIG. 7 is a detailed side view illustrating second and fourth terminals of a bridge board of FIG. 5.
Figure 8:
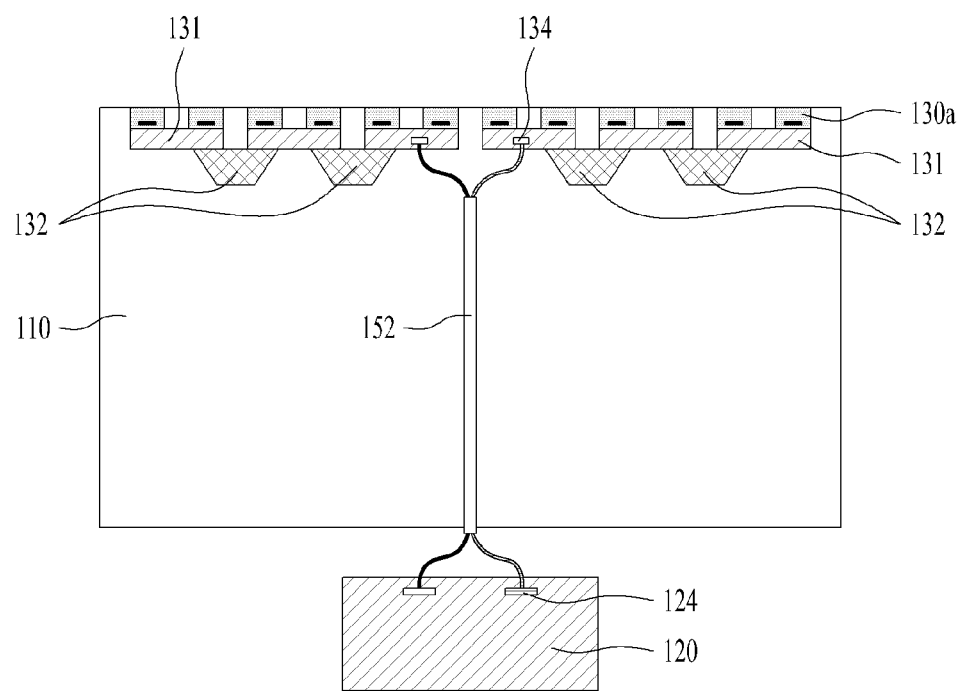
FIG. 8 is a detailed plane view illustrating other embodiment of a connection structure of a main board and an auxiliary board in a display device.

FIG. 4 is a detailed plane view illustrating one embodiment of a connection structure of a main board and an auxiliary board in a display device. Also, FIG. 5 is a detailed plane view illustrating another embodiment of a connection structure of a main board and an auxiliary board in a display device, FIG. 6 is a detailed side view illustrating first and third terminals of a bridge board of FIG. 5, and FIG. 7 is a detailed side view illustrating second and fourth terminals of a bridge board of FIG. 5. Finally, FIG. 8 is a detailed plane view illustrating other embodiment of a connection structure of a main board and an auxiliary board in a display device. The display panel 110 having a curvature is shown in FIGS. 4, 5 and 8.

First of all, referring to FIG. 4, the main board 120 may be arranged to be spaced apart from the display panel 110. In more detail, the main board 120 may be arranged to depart from the rear surface of the display panel 110, that is, to be away from a space between the rear surface and a wall facing the rear surface. The main board 120 is not arranged between the wall and the panel 110, which have a curvature, whereby the main board 120 is not required to be modified within a great range. Therefore, the display panel 110 may stably be provided on a wall having a predetermined curvature together with the auxiliary board 130 by the spaced main board 120 while being modified to have a curvature corresponding to the wall.

Meanwhile, the spaced main board 120, as shown in FIG. 4, may be connected with the auxiliary board 130 by the cable 121 which is longitudinally extended. However, the cable 121 which is extended may cause many problems. Generally, the cable 121 may be comprised of a flexible flat cable (hereinafter, 'FFC'). The FFC may be comprised of wires arranged on the same plane and a cover covering the wires. Since the FFC has a thin thickness and may simultaneously connect a plurality of terminals with one another, the FFC is generally used for connection between circuits in the display device 100. However, since the FFC includes a cover of a simple structure and does not include a cover for shielding electromagnetic waves, the extended FFC may generate EMI noise (electromagnetic interference noise). Particularly, since a strict EMI limitation is applied to the airplane for safety, the FFC has many limitations in application to the display device 100 for the airplane. Also, if the FFC is longitudinally extended, signal loss may be generated, whereby it is difficult to space the main board 120 at a certain distance or more. Moreover, since the FFC has a thin thickness but has a wide width, it is difficult for the FFC to be modified to be twisted or folded. Therefore, it is difficult for the FFC to be applied to an arrangement position where a shape change is seriously generated.

Nonetheless, since the main board 120 and the auxiliary board 130 are initially designed to be connected with each other by the cable 121 which is the FFC, a design change is required to use another type cable, whereby additional cost is required. For example, the main board 120 and the auxiliary board 130 are designed to have terminals suitable for the FFC. For this reason, the connection structure of the main board 120 and the auxiliary board 130 has been improved to solve the aforementioned problems without design change, and the improved structure is shown in FIGS. 5 to 7.

Referring to FIG. 5, the display device 100 may include a bridge board 140 interposed between the main board 120 and the auxiliary board 130. The bridge board 140 may be configured to connect the main board 120 and the auxiliary board 130, which are spaced apart from each other, with each other. In more detail, the bridge board 140 may include a first bridge board 140a connected with the auxiliary board 130 through a first cable 151 and connected with the main board 120 through a second cable 152. The first bridge board 140a may include a first terminal 141 connected with the first cable 151 and a second terminal 142 connected with the second cable 152. As shown in FIG. 6, the first terminal 141 may be comprised of a terminal configured to be coupled with the existing FFC in the same manner as the terminal 133 of the auxiliary board 130, wherein the terminal 133 faces the first terminal 141. Therefore, the first terminal 141 and the terminal 133 may be connected with each other by the existing FFC. That is, the auxiliary board 130 may be connected with the first auxiliary bridge 140a by the FFC. On the other hand, as shown in FIG. 7, the second terminal 142 may be configured to be coupled with the second cable 152 which is another type cable different from the FFC. Therefore, the second cable 152 may be comprised of a coaxial cable different from the FFC, and the auxiliary board 130 may be connected with the main board 120 by the first auxiliary bridge 140a through the second cable 152 which is a coaxial cable.

Meanwhile, in order that the main board 120 is directly connected with the second cable 152 which is a coaxial cable, a design change of the main board 120 having only the terminal 123 for connection of the existing FEC is required. Therefore, in order to avoid such design change, the second bridge board 140b may additionally be applied as the bridge board 140. In more detail, the second bridge board 140b may be configured to be connected with the first bridge board 140a through the second cable 152 and connected with the main board 120 through a third cable 153. Also, the second bridge board 140b may include a third terminal 143 connected with the third cable 153 and a fourth terminal 144 connected with the second cable 152. As shown in FIG. 6, the third terminal 143 may be comprised of a terminal configured to be coupled with the existing FFC in the same manner as the terminal 123 of the main board 120, wherein the terminal 123 faces the third terminal 143. Therefore, the third terminal 143 and the terminal 123 may be connected with each other by the existing FFC. That is, the main board 120 may be connected with the second auxiliary bridge 140b by the FFC. On the other hand, as shown in FIG. 7, the fourth terminal 144 may be configured to be coupled with the second cable 152 which is a coaxial cable. Therefore, the main board 120 may be connected with the auxiliary board 130 by the second auxiliary bridge 140b through the second cable 152 which is a coaxial cable.

As described above, the main board 120 and the auxiliary board 130 may be connected with each other using the first and second bridge boards 140a and 140b and the first to third cables 151, 152 and 153. Also, the first and second bridge boards 140a and 140b include the first and third terminals 141 and 143, which may be connected with the FFC, to allow the main board 120 and the auxiliary board 130 to be connected with the first and third cables 151 and 153, that is the existing FFC. Therefore, the existing main board 120 and auxiliary board 130 may be used without design change, whereby additional production cost is not increased. On the other hand, the first and second bridge boards 140a and 140b include the second and fourth terminals 142 and 144, and thus may be connected with each other by a coaxial cable different from the FFC. The coaxial cable has a proper shielding structure and thus generates EMI noise which is remarkably reduced, whereby the coaxial cable may be used in any position, for example, in the airplane, without limitation. Also, the coaxial cable does not generate signal loss even though it becomes long. Also, since the coaxial cable has a circular section of a small diameter, it may easily be modified and is applicable to even a place of any shape. Therefore, the main board 120 may be spaced apart from the panel 110 without a design change of the boards 120 and 130 and limitation in accordance with application of the aforementioned bridge board 140. Therefore, the display device 100 may stably be mounted on a wall having a curvature while exerting intended performance. Also, even though the main board 120 is spaced apart from the panel 110, since the main board 120 may transmit a control signal to the auxiliary board 130 without loss, a plurality of panels 110 spaced apart from the single main board 120 at different distances may be connected with the single main board 120, and may simultaneously be controlled by the single main board 120. Therefore, the plurality of display devices 100 may be controlled more effectively and efficiently.

Considering the above structure, the bridge boards 140: 140a and 140b may be configured to connect the main board 120 with the auxiliary board 130 by using at least two different cables 151 and 15 such that the display device 100 may be arranged more stably and efficiently under a changed arrangement environment (that is, wall having a curvature). In more detail, the cable 151 that connects the bridge board 140 with the auxiliary board 130 may be configured to be different from the cable 152 that connects the bridge board 140 with the main board 120. That is, the bridge board 140 may serve as a kind of gender that allows another type cable to be applied if necessary. Also, the first and second bridge boards 140a and 140b and the second cable 152 may serve as one connection module. Therefore, even though the second cable 152 is disconnected, such a connection module may easily be replaced with another connection module which is previously manufactured, whereby efficiency maintenance may be performed. Moreover, a plurality of connection modules having the second cable 152 of various lengths may previously be manufactured, and connection modules of different lengths, which are previously manufactured to be suitable for the distance between the main board 120 and the panel 110, may be applied conveniently. Therefore, arrangement of the display device 100 may be performed more efficiently.

Moreover, as shown in FIG. 8, the second cable 152 which is a coaxial cable may directly be coupled to the main board 120 and the auxiliary board 130 without the bridge board 140. In this case, the terminal 124 of the main board 120 and the terminal 134 of the auxiliary board 130 may have the same structure as that of the second and fourth terminals 142 and 144 configured to be connected with the aforementioned coaxial cable shown in FIG. 7. The configuration of FIG. 8 requires the design change of the main board 120 and the auxiliary board 130 but the main board 120 may be spaced apart from the panel without performance deterioration even without the bridge board 140. Therefore, the display device 100 may have a simpler structure and may stably be arranged on the wall having a curvature.

The elements of FIGS. 4 to 8 have been described regarding the panel 110 having a curvature but may equally be applied to the plane panels 110 to obtain the same technical effect. For example, the spaced main board 120 and the elements of FIGS. 4 to 8, which connect the main board 120 to the auxiliary board 130, may be applied to the single main board 120 spaced to simultaneously control a plurality of plane panels 110.

Meanwhile, when the display panel 110 is actually arranged on the wall in the display device 100, a separate bracket may be used to stably fix the display panel 110 to the wall. The bracket may be optimized for arrangement on the wall having a curvature, and will be described in more detail with reference to the related drawings.

Figure 9:
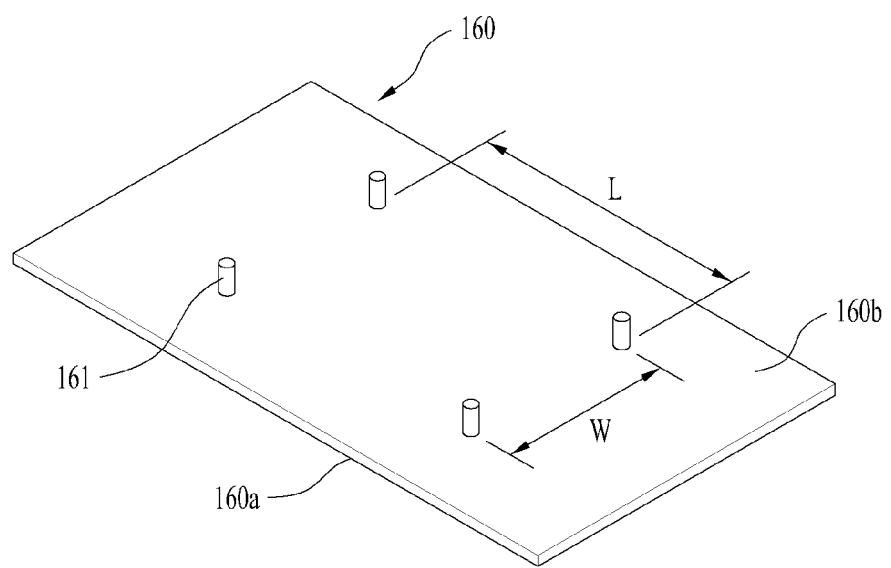
FIG. 9 is a perspective view illustrating an arrangement bracket of a display device.
Figure 10:
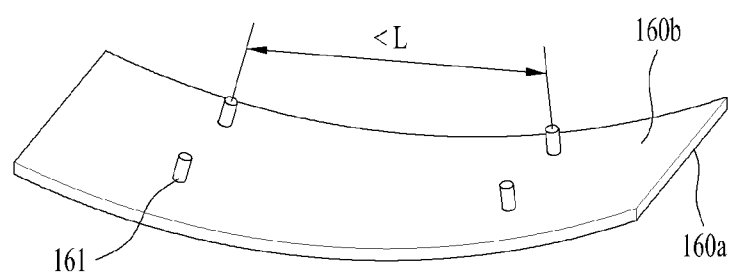
FIG. 10 is a perspective view illustrating a modified state of an arrangement bracket.
Figure 10:
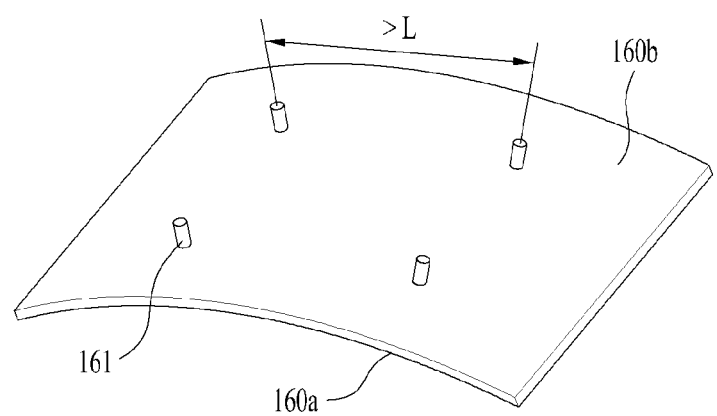
Figure 11:
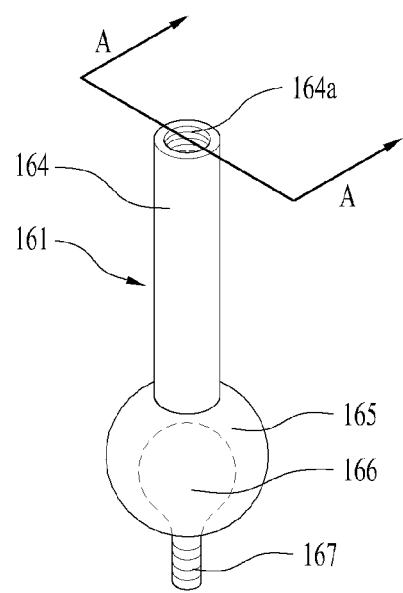
FIG. 11 is a perspective view illustrating fixing portions of an arrangement bracket of a display device.
Figure 12:
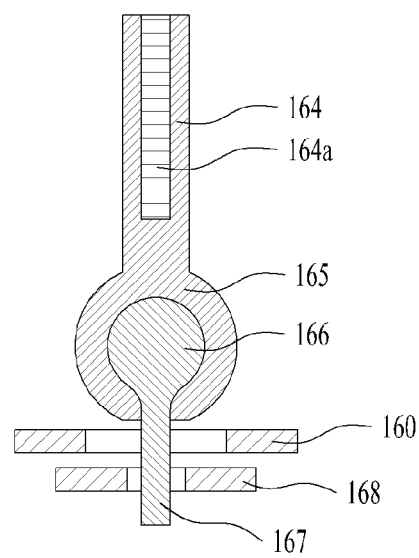
FIG. 12 is a sectional view taken along line A-A of FIG. 11.
Figure 13:
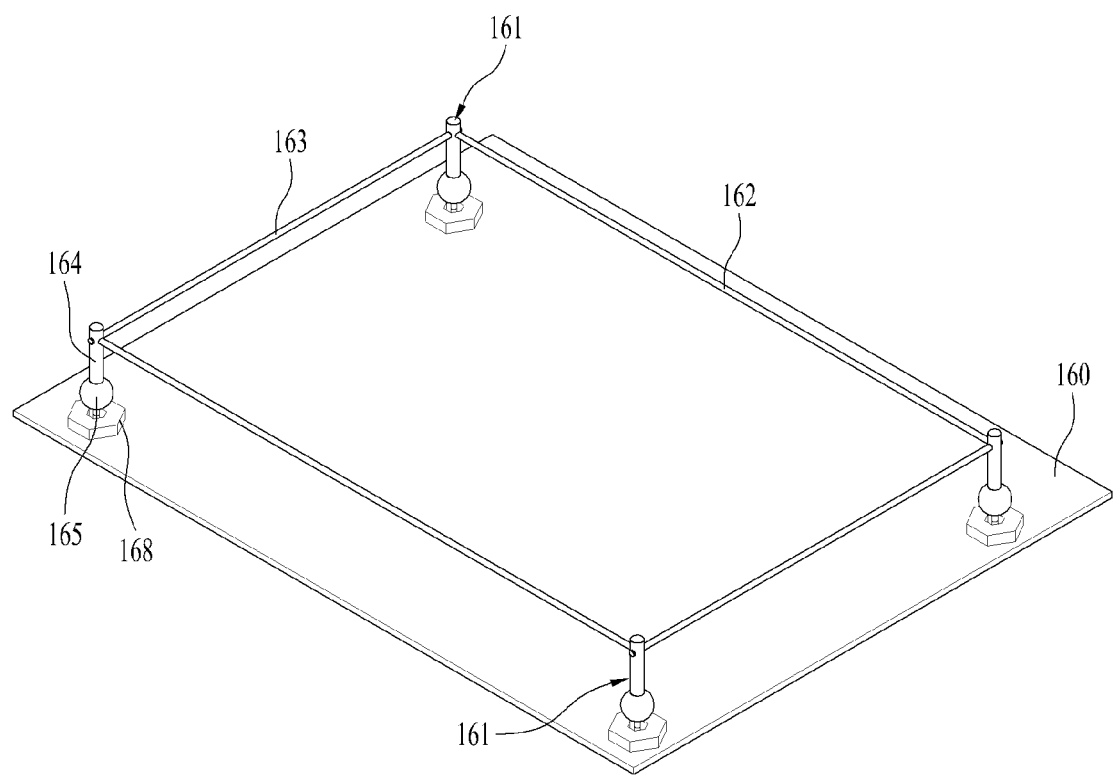
FIG. 13 is a perspective view illustrating an arrangement bracket to which a spacer is applied between fixing portions.

FIG. 9 is a perspective view illustrating an arrangement bracket of a display device. FIG. 10 is a perspective view illustrating a modified state of an arrangement bracket. FIG. 11 is a perspective view illustrating fixing portions of an arrangement bracket of a display device. FIG. 12 is a sectional view taken along line A-A of FIG. 11. FIG. 13 is a perspective view illustrating an arrangement bracket to which a spacer is applied between fixing portions. For understanding in FIGS. 9 to 13, the bracket faces the wall and a rear surface coupled with the bracket is shown to be exposed.

Referring to FIG. 9, the display device 100 may include a bracket 160 provided to the rear surface of the display panel 110. The bracket 160 may be configured to fix the panel 110 onto the wall. In more detail, the bracket 160 may have a thin plate shaped body. This body may be made of a flexible material, for example, a metal material. Therefore, the bracket 160 may be modified together with the panel 110 to have a predetermined curvature. The bracket 160 may include a first surface 160a facing the rear surface of the display panel 110 and a second surface 160b facing a wall which will be arranged. The first surface 160a may be attached to the rear surface of the display panel 110 by a predetermined fixing means, for example, an adhesive or magnetic body. The second surface 160b may be provided with a plurality of fixing portions 161 configured to be fixed to the wall. The fixing portions 161 may be protruded from the second surface 160b at a predetermined length, and may include screw threads therein to be fixed to the wall. Considering this structure, the fixing portions 161 may be referred to studs or stud pins. For stable fixture of the panel 110, the fixing portions 161 may be spaced apart from one another at predetermined intervals and thus arranged on the second surface 160b. For example, the fixing portions 161 may be spaced apart from one another at a first interval L, and at the same time may be spaced apart from one another at a second interval W relatively shorter than the first interval L. A coupling member coupled with the fixing portions 161 may previously be arranged at a predetermined position of the wall on which the display panel 110 is arranged. Therefore, the positions of the fixing portions 161 and their intervals L and W may previously be determined for coupling with the coupling member of the wall.

However, as shown in FIG. 10, the bracket 160 needs to be modified to be adapted to a curvature of the display panel 110 and/or the wall, which will be coupled therewith. FIG. 10 illustrates the bracket 160 modified to have a curvature along a length direction as an example. First of all, as shown in FIG. 10(a), the fixing portions 161 are fixed to a body of the bracket 160 so that the fixing portions 160 do not move. In this case, if the bracket 160 is modified to be convex toward an outer side, that is, the display panel 110, the first interval L may become shorter than a previously set interval. On the other hand, as shown in FIG. 10(b), if the bracket 160 is modified to be convex toward an inner side, that is, the wall, the first interval L may become longer than the previously set interval. Likewise, although not shown, if the bracket 160 is modified to have a curvature along a width direction, the second interval W may be changed. Therefore, if the bracket 160 is modified to have a curvature, the bracket 160 cannot be aligned with a fixing member arranged on the wall, due to such an interval change of the first or second interval L or W, whereby it may be difficult for the display panel 110 to be exactly arranged on the wall.

For these reasons, the fixing portions 161 may be configured to mutually maintain a certain interval. That is, the fixing portions 161 may be configured to move toward another fixing portions adjacent thereto, and therefore the first and second intervals L and W may properly be controlled. In more detail, as shown in FIGS. 11 and 12, the fixing portion 161 may include a pin 164 having a predetermined length. The pin 164 is a portion actually coupled to the wall, and may include a screw portion 164a formed therein to be coupled with the coupling member arranged on the wall. The fixing portion 161 may also include a bearing 166 rotatably coupled with the pin 164. The bearing 166 may include a spherical shaped body, and may have a protrusion 167 extended from the spherical shaped body to a lower side. The pin 164 may have a socket 165 provided below the bearing 166 to be coupled with the bearing 166. The socket 165 has a space of a predetermined size therein, and the bearing 166, more specifically the bearing body may rotatably be accommodated in this space. Also, the protrusion 167 of the bearing 166 may be provided to pass through the body of the bracket 160, and may be fixed to the body of the bracket 160 by the coupling member. For example, a screw thread may be formed on an outer surface of the protrusion 167, and a nut 168 may be fixed to the protrusion 167, whereby the bearing 166 may be fixed to the bracket 160 in a state that it is rotatably connected with the pin 164. In accordance with this configuration, the fixing portion 161 may be fixed to the bracket 160 and its portion, exactly the pin 164 may be rotated with respect to the bracket 160. Therefore, even in the case that the first interval L and the second interval W are changed by the change of the bracket 160, the fixing portions 160 may be configured movably toward another fixing portions adjacent thereto, such that the first and second intervals L and W may be controlled. Therefore, the fixing portions 161 may be configured to mutually maintain a certain interval. Also, for this interval control, the fixing portions 161 move relatively with respect to the bracket 160. For this reason, the fixing portions 161 may be aligned with the fixing member arranged on the wall even in case of the change of the bracket 160, and the display panel 160 may exactly be arranged on the wall.

Moreover, as shown in FIG. 13, the bracket 160 may include spacers 162 and 163 provided between the fixing portions 161. In more detail, the bracket 160 may include a first spacer 162 arranged at the first interval L and a second spacer 163 arranged at the second interval W relatively shorter than the first interval L. The first and second spacers 162 and 163 may respectively be coupled with the fixing portions 161 adjacent thereto. Therefore, the fixing portions 161, that is, at least adjacent fixing portions 161 may be connected with each other by the spacers 162 and 163, and may maintain a certain interval with respect to each other, that is, the first and second intervals L and W which are previously set. That is, the fixing portions 161 and the spacers 162 and 163 may be fixed to one another, and may form one frame which is relatively movable with respect to the bracket 160. Even in the case that the bracket 160 is modified to have a curvature, the certain interval between the fixing portions 161 is maintained and at the same time the pin 164 may only move relatively with respect to the modified bracket 160 and the bearing 166 fixed to the bracket 160. Therefore, since the fixing portions 161 are connected with one another by the spacers 162 and 163 at the preset intervals L and W, even though the bracket 160 is modified, all the fixing portions 161 may automatically move to be suitable for the modified amount of the bracket 160 at one time while maintaining the intervals L and W. That is, the fixing portions 161 do not need to be individually controlled to be suitable for the first and second intervals L and W and may be maintained at the exact intervals L and W. For this reason, the fixing portions 161 may be aligned more conveniently together with the fixing member arranged on the wall, and the display panel 160 may be arranged on the wall more exactly.

The display device 100 may be arranged to be suitable for various environments and conditions different from general environments and conditions due to the aforementioned configuration, and one of the environments and conditions may be an airplane cabin as an example. In order to provide passengers with various kinds of information related to airplane trip, the airplane cabin may include a plurality of display panels 110 arranged to be suitable for surfaces of various shapes in the airplane cabin and required to be integrally controlled. Therefore, since the display device 100 includes a panel 110 which may be modified, a main board, that is, control board 120, which is spaced apart from the panel, and a connection module (for example, bridge board) 140 designed to connect the main board 120 with the panel 110 as described above, the display device 100 may fulfil the conditions required for the airplane cabin. The display device 100 applied to the airplane cabin will be described in detail with reference to the related drawings.

Figure 14:
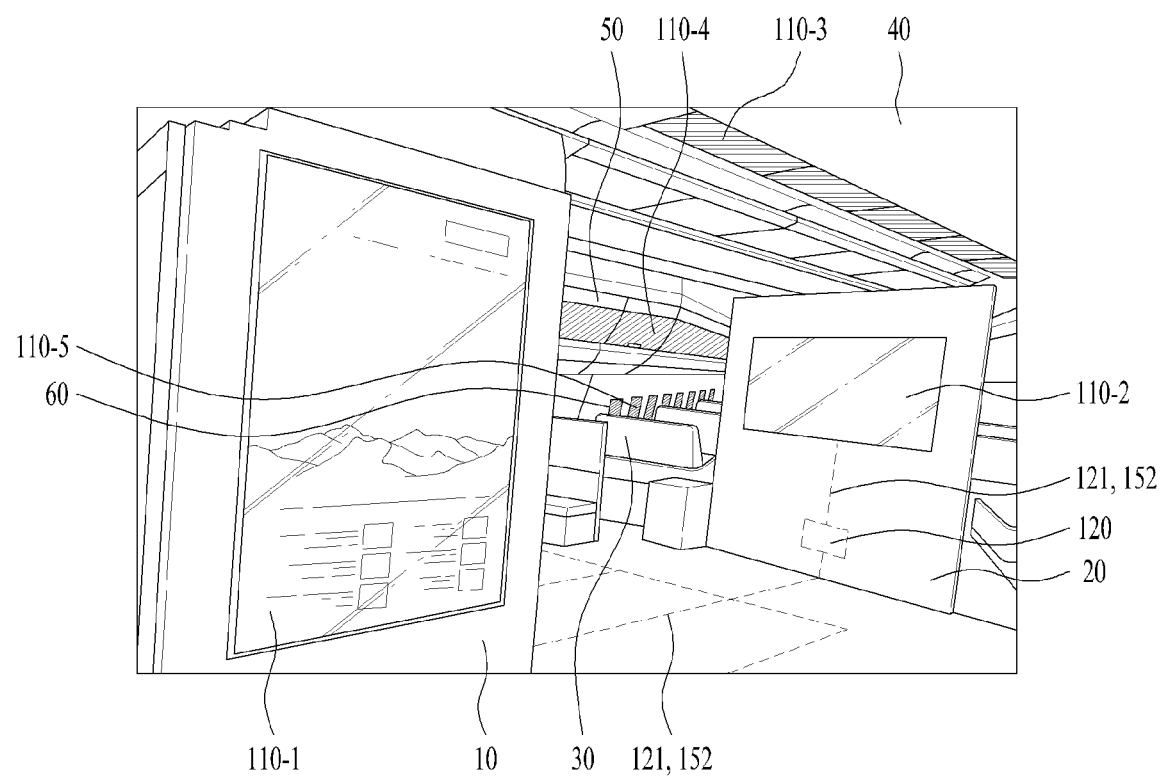
FIG. 14 is a schematic view illustrating an example of a display device applied to an airplane cabin.
Figure 15:
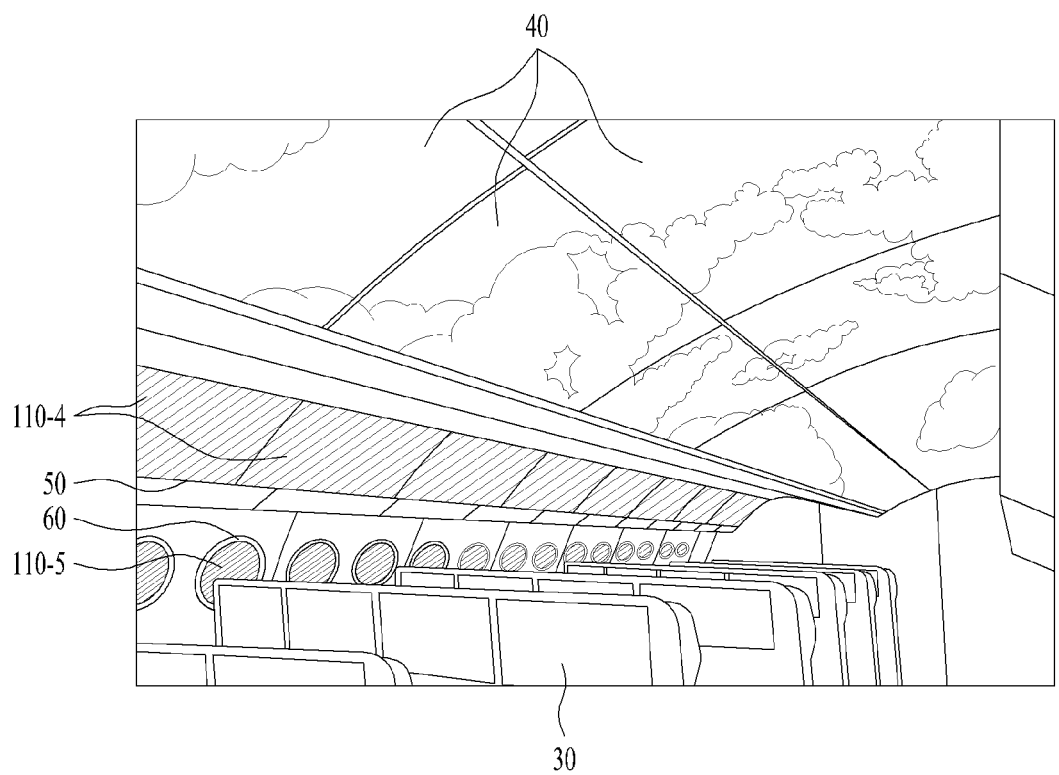
FIG. 15 is a detailed schematic view illustrating an example of a display device applied to a ceiling, a bin and a window of an airplane cabin.
Figure 16:
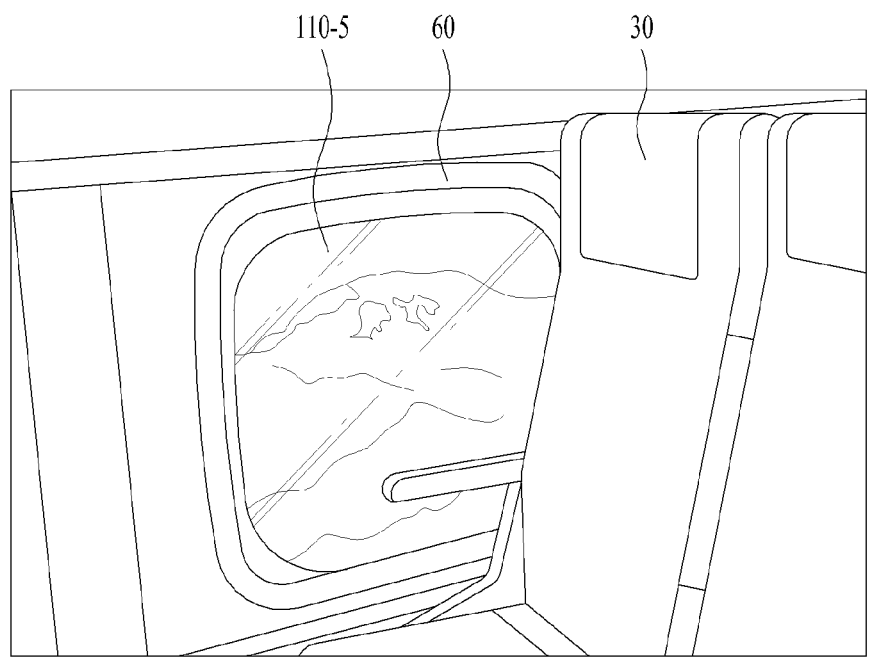
FIG. 16 is a detailed schematic view illustrating an example of a display device applied to a window of an airplane cabin.

FIG. 14 is a schematic view illustrating an example of a display device applied to an airplane cabin. Also, FIG. 15 is a detailed schematic view illustrating an example of a display device applied to a ceiling, a bin and a window of an airplane cabin, and FIG. 16 is a detailed schematic view illustrating an example of a display device applied to a window of an airplane cabin. Hereinafter, a description will be give based on distinct features of the display device 100 applied to the airplane cabin, and the aforementioned description will be applied to the same elements as those shown in FIGS. 2 to 13 without modification.

First of all, referring to FIG. 14, the display device 100 may include a first panel 110-1 arranged on a signboard 10 in the airplane as the display panel 110. The signboard 10 may be erected on the floor of the airplane cabin to adjoin an entrance of the cabin or attached to the ceiling of the cabin. In the signboard 10, the first panel 110-1 may include various kinds of information guiding passengers to enter the cabin, whereby the signboard 10 may be referred to as a welcome board. Also, the display panel 110 may include a second panel 110-2 arranged on a partition 20 in the cabin. The partition 20 serves to divide the cabin into predetermined areas, and may be referred to as a bulkhead. The second panel 110-2 may be arranged on the partition 20 to provide passengers with trip information and entertainment.

As shown in FIGS. 14 and 15, the panel 110 of the display device 100 may include a third panel 110-3 arranged on the ceiling 40 of the airplane cabin. The third panel 110-3 may provide passengers with various kinds of trip information from the ceiling 40. Particularly, as shown in FIG. 15, the panel 110 may include a plurality of third panels 110-3 configured to cover the entire ceiling 40, thereby displaying images providing passengers with a comfortable environment. Also, the display panel 110 may include a fourth panel 110-4 provided to a bin 50 that keeps baggage of the passengers. The bin 50 may generally be provided to a sidewall of the airplane cabin and arranged above a seat 30 and therefore is referred to as an overhead bin. The bin 50 may have a cover that may be opened or closed to allow baggage stored therein not to be dropped down, and the fourth panel 110-4 may be arranged on the cover of the bin 50 to be exposed to a user. The fourth panel 110-4 may display information related to the baggage in the bin 50 as well as various kinds of trip information. Moreover, as shown in FIGS. 14 to 16, the display panel 110 may include a fifth panel 110-5 arranged on a window 60. Generally, the window 60 may be provided on the sidewall of the airplane cabin, and may allow the passenger to view the outside of the airplane. In more detail, the window 60 may include an opening of a predetermined size formed on the sidewall and a transparent member closing the opening. The fifth panel 110-5 may be arranged on the opening instead of the transparent member or additionally arranged on the transparent member arranged on the opening. The fifth panel 110-5 may display an environment of the outside of the airplane as an image instead of a general window to allow a passenger to view it. Also, the fifth panel 110-5 may provide a passenger with various kinds of trip information and entertainment.

All of the panels 110-1 to 110-5 may be comprised of OLEDs as described above, and are associated with the auxiliary board 130, that is, a plurality of board modules 131 (see FIG. 3) configured to be adapted to modification of the panel. Therefore, the panels 110-1 to 110-5 may stably be arranged while being modified to be suitable for shapes of various arrangement positions 10, 20 and 40 to 60 in the airplane together with the auxiliary board 130 arranged on their rear surfaces. Particularly, the panel 110 and the auxiliary board 130, which may be modified, may be favorable to be arranged on the ceiling 40, the bin 50 and the window 60, which have a shape change, that is, a curved surface. Also, the bracket 160 of FIGS. 9 to 13 may be applied between the panels 110-1 to 110-5 and the arrangement positions 10, 20 and 40 to 60 to enable more exact and easier arrangement.

Meanwhile, since it is difficult for the main board 120 to be modified within a great range, the main board 120 may be spaced apart from the panels 110-1 to 11o-5 and thus arranged at various positions in the airplane cabin. For example, as shown in FIG. 14, the main board 120 may be embedded in the partition 20. Also, the main board 120 spaced as above may be connected with all of the display panels 110-1 to 110-5 through connection modules as denoted by dotted lines, and the elements disclosed in FIGS. 4, 5 and 6 to include the cables 121 and 151 may be used as the connection modules. Also, the main board 120 may be manufactured as a single control module for control of the plurality of display panels 110-1 to 110-5 by being associated with the other parts. Therefore, the single main board 120 or the control module may control all of the panels 110-1 to 110-5 effectively and integrally. Moreover, since the plurality of main boards 120 are not arranged on the panels 110-1 to 110-5 respectively, the display device 100 does not occupy a large space, and may be suitable for a narrow airplane cabin.

For these reasons, the display device 100 of the present application may fulfil the conditions required to provide the display device in the airplane cabin.

The above detailed description is to be considered in all respects as illustrative and not restrictive. The scope of the specification should be determined by reasonable interpretation of the appended claims and all change which comes within the equivalent scope of the present application are included in the scope of the present application.

The invention claimed is:

1. A display device comprising:
    a flexible display panel;
    a main board spaced apart from the flexible display panel and configured to control a driving signal;
    an auxiliary board disposed to be adjacent to the flexible display panel and configured to provide the flexible display panel with the driving signal received from the main board, in an appropriate form for image reproduction;
    a bridge board interposed between the main board and the auxiliary board to connect the main board with the auxiliary board;
    a bracket provided on a rear surface of the flexible display panel;
    fixing portions having a first end rotatably coupled to a rear surface of the bracket and a second end coupled to a predetermined wall; and
    spacers between two of the fixing portions to maintain a distance between the two of the fixing portions.

2. The display device of claim 1, wherein the bridge board is configured to connect the main board with the auxiliary board by using at least a first cable and a second cable.

3. The display device of claim 2, wherein the first cable connecting the bridge board with the auxiliary board is different from the second cable connecting the bridge board with the main board.

4. The display device of claim 1, wherein the bridge board includes a first bridge board connected with the auxiliary board through a first cable and connected with the main board through a second cable.

5. The display device of claim 1, wherein the bridge board further includes:
    a first bridge board connected with the auxiliary board through a first cable, and
    a second bridge board connected with the first bridge board through a second cable and connected with the main board through a third cable.

6. The display device of claim 5, wherein the first bridge board includes a first terminal connected with the first cable and a second terminal connected with the second cable, and the second bridge board includes a third terminal connected with the third cable and a fourth terminal connected with the second cable.

7. The display device of claim 5, wherein the first and third cables are made of flexible flat cables, and the second cable is made of a coaxial cable.

8. The display device of claim 1, wherein the auxiliary board is directly connected with the flexible display panel.

9. The display device of claim 1, wherein the flexible display panel is configured to have a predetermined curvature, and the auxiliary board is divided into a plurality of board modules arranged along a curvature forming direction of the flexible display panel.

10. The display device of claim 9, wherein the board modules are connected with each other by an auxiliary connector.

11. The display device of claim 1, wherein the fixing portions are movably configured toward another fixing portions adjacent thereto.

12. The display device of claim 1, wherein the spacers include a first set of spacers having a first length and a second set of spacers having a second length.

13. The display device of claim 1, wherein the fixing portions include sockets having a space at the first end; and wherein the bracket includes bearings rotatably coupled with the sockets respectively.

14. The display device of claim 1, wherein each fixing portions having a screw portion at the second end coupled with a coupling member arranged on the predetermined wall.

15. A display device comprising:
a flexible display panel;
a main board spaced apart from the flexible display panel and configured to control a driving signal;
an auxiliary board disposed to be adjacent to the flexible display panel and configured to provide the flexible display panel with the driving signal received from the main board, in an appropriate form for image reproduction;
a bridge board interposed between the main board and the auxiliary board to connect the main board with the auxiliary board;
a bracket provided on a rear surface of the flexible display panel; and
fixing portions having a first end rotatably coupled to a rear surface of the bracket and a second end coupled to a predetermined wall,
wherein the fixing portions include sockets having a space at the first end, and
wherein the bracket includes bearings rotatably coupled with the sockets respectively.

* * * * *